(12) United States Patent
Tang et al.

(10) Patent No.: US 7,737,723 B1
(45) Date of Patent: *Jun. 15, 2010

(54) TRANSPARENT FIELD RECONFIGURATION FOR PROGRAMMABLE LOGIC DEVICES

(75) Inventors: Howard Tang, San Jose, CA (US); Jack T. Wong, Fremont, CA (US); Clark Wilkinson, Austin, TX (US); Jeffrey S. Byrne, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/467,800

(22) Filed: May 18, 2009

Related U.S. Application Data

(63) Continuation of application No. 11/293,941, filed on Dec. 5, 2005, now Pat. No. 7,538,574.

(51) Int. Cl.
*H03K 19/173* (2006.01)
(52) U.S. Cl. .............. 326/38; 326/39; 326/40
(58) Field of Classification Search .............. 326/38–41
See application file for complete search history.

(56) References Cited

U.S. PATENT DOCUMENTS

| | | | |
|---|---|---|---|
| 5,844,422 A | 12/1998 | Trimberger et al. | |
| 6,028,449 A | 2/2000 | Schmitt | |
| 6,218,858 B1 | 4/2001 | Menon et al. | |
| 6,507,211 B1 | 1/2003 | Schultz | |
| 6,573,748 B1 | 6/2003 | Trimberger | |
| 6,624,656 B1 | 9/2003 | Fox et al. | |
| 6,717,433 B2 * | 4/2004 | Barbier et al. | 326/16 |
| 6,851,047 B1 | 2/2005 | Fox et al. | |
| 6,870,397 B1 | 3/2005 | Fox et al. | |
| 6,924,663 B2 | 8/2005 | Masui et al. | |
| 7,088,132 B1 | 8/2006 | Tang et al. | |
| 7,095,247 B1 | 8/2006 | Tang et al. | |
| 7,099,227 B1 | 8/2006 | Zhou | |
| 7,102,555 B2 * | 9/2006 | Collins et al. | 341/120 |
| 7,111,217 B1 * | 9/2006 | Schultz | 714/727 |
| 7,180,776 B1 | 2/2007 | Wennekamp et al. | |
| 7,199,608 B1 | 4/2007 | Trimberger | |
| 7,218,137 B2 | 5/2007 | Vadi et al. | |
| 7,366,306 B1 | 4/2008 | Trimberger | |
| 7,373,668 B1 | 5/2008 | Trimberger | |
| 7,375,549 B1 | 5/2008 | Tang et al. | |
| 7,406,642 B1 * | 7/2008 | Lau | 714/727 |
| 7,480,843 B1 * | 1/2009 | Jacobson | 714/725 |
| 7,538,574 B1 | 5/2009 | Tang et al. | |
| 7,554,358 B1 | 6/2009 | Tang et al. | |
| 7,652,500 B1 | 1/2010 | Tang et al. | |

(Continued)

OTHER PUBLICATIONS

Lattice Semiconductor Corporation, "LatticeXP Family Data Sheet," Version 01.2, Feb. 2005, available at www.latticesemi.com.

(Continued)

*Primary Examiner*—Vibol Tan

(57) ABSTRACT

In accordance with an embodiment of the present invention, a programmable logic device (PLD, such as a field programmable gate array (FPGA)) includes a plurality of input/output blocks adapted to precondition registers within the programmable logic device with desired signal values prior to release of control of the input/output blocks to user-defined logic provided by a reconfiguration.

17 Claims, 7 Drawing Sheets

U.S. PATENT DOCUMENTS

| | | | |
|---|---|---|---|
| 2002/0163840 | A1 | 11/2002 | Hiraki et al. |
| 2004/0025086 | A1 | 2/2004 | Gorday et al. |
| 2005/0083743 | A1 | 4/2005 | Andrei et al. |
| 2005/0248364 | A1 | 11/2005 | Vadi et al. |
| 2006/0067102 | A1 | 3/2006 | Yamada et al. |

OTHER PUBLICATIONS

Altera Corporation, "Max II Device Handbook," Version 1.1, Dec. 2004, available at www.altera.com.

Actel Corporation, "ProASIC3E Flash Family FPGAs," Oct. 2005, available at www.actel.com.

Lattice Semiconductor Corporation, LatticeXP Family Data Sheet, Version 01.2, Feb. 2005, 77 pages.

Altera R, Max II Device Handbook, www.altera.com, M115V1-1.7, 330 pages, no date.

Actel Corporation, ProASICE Flash Family FPGAs, ARM7 TM Soft IP Support in ProASIC3E ARM7-Ready Device, Oct. 2005, 166 pages.

U.S. Appl. No. 10/809,658 Howard Tang.
U.S. Appl. No. 11/243,255 Howard Tang.
U.S. Appl. No. 11/293,941 Howard Tang.
U.S. Appl. No. 11/350,436 Howard Tang.
U.S. Appl. No. 11/397,985, filed Apr. 5, 2006, Fontana et al.

\* cited by examiner

US 7,737,723 B1

TRANSPARENT FIELD RECONFIGURATION FOR PROGRAMMABLE LOGIC DEVICES

RELATED APPLICATION DATA

This application is a continuation of U.S. application Ser. No. 11/293,941, filed Dec. 5, 2005, which is incorporated by reference in its entirety.

TECHNICAL FIELD

The present invention relates generally to electrical circuits and, more particularly, to reconfiguration of programmable logic devices.

BACKGROUND

A programmable logic device, such as field programmable gate array (FPGA) or a complex programmable logic device (CPLD), may be used in a variety of applications. A programmable logic device (PLD) offers the advantage of being reprogrammable in the field (e.g., while on the circuit board in its operational environment).

A drawback of a conventional PLD is that, while being programmed (which may take seconds to load an external configuration bitstream), the PLD enters a sleep state, with its input and output pins typically disabled (e.g., non-responsive to input signals while providing indeterminate output signals). If the PLD is in a critical path or is used to control critical functions, these drawbacks may be unacceptable. Furthermore, glitches on the output signals provided by the PLD during programming or after reconfiguration generally would be unacceptable while the PLD is controlling critical functions. As a result, there is a need for improved programming and configuration techniques for PLDs.

SUMMARY

In accordance with one embodiment of the present invention, a programmable logic device includes a plurality of input/output blocks having adapted to precondition registers within the programmable logic device with desired signal values prior to release of control of the input/output blocks to user-defined logic provided by a reconfiguration; a plurality of logic blocks; configuration memory cells adapted to store first configuration data for configuration of the logic blocks and the input/output blocks of the programmable logic device; non-volatile memory adapted to store second configuration data and transfer the second configuration data to the configuration memory cells for the reconfiguration of the programmable logic device; and at least a first data port adapted to receive commands for controlling the reconfiguration of the programmable logic device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
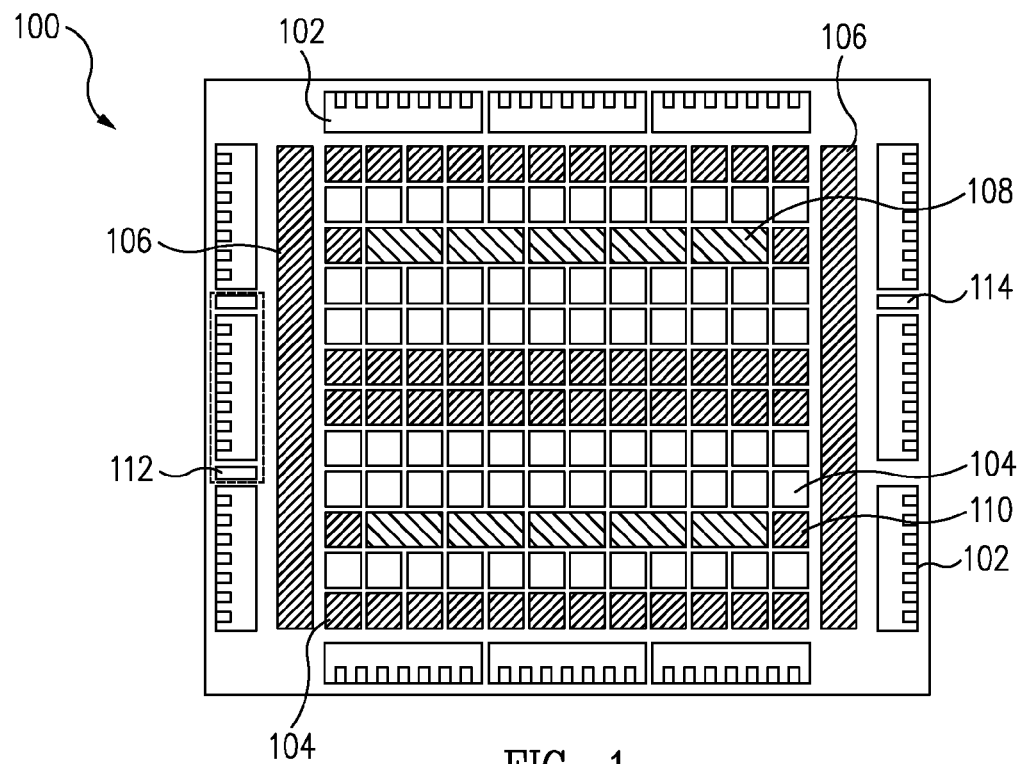
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 includes input/output (I/O) blocks 102 and programmable logic blocks 104, which are used to provide I/O functionality (e.g., one or more I/O and/or memory interface standards) and logic functionality (e.g., LUT-based logic), respectively, for PLD 100. PLD 100 may also include one or more non-volatile memory 106 (e.g., EEPROM or flash memory), volatile memory 108 (e.g., block SRAM), and clock-related circuitry 110 (e.g., PLL circuits).

PLD 100 also includes one or more data ports 112 and/or 114, which for example may be used for programming PLD 100 (e.g., non-volatile memory 106 and/or configuration memory, as explained further herein). For example, data port 112 may represent a programming port such as a central processing unit (CPU) port, also referred to as a peripheral data port or a sysCONFIG programming port. Data port 114 may represent, for example, a programming port such as a joint test action group (JTAG) port by employing standards such as Institute of Electrical and Electronics Engineers (IEEE) 1149.1 or 1532 standards.

Non-volatile memory 106, if present, may be used to store configuration data within PLD 100 for transfer to the configuration memory of PLD 100 upon power up or during reconfiguration of PLD 100. This may drastically reduce the time to reconfigure PLD 100 relative to an external bitstream (e.g., reduce the time from seconds to microseconds for loading of configuration data into the configuration memory).

Non-volatile memory 106 may also be used to provide background programming functionality for PLD 100. For example for background programming, PLD 100 may remain in user mode, based on the configuration data stored in configuration memory within PLD 100, while non-volatile memory 106 is programmed with new configuration data (e.g., a new user defined pattern). Once the new configuration data is stored in non-volatile memory 106, this data can be transferred from non-volatile memory 106 to the configuration memory to reconfigure PLD 100, a process sometimes referred to as refresh. As explained further herein, the refresh process can be initiated by a signal or instruction provided to data port 112 or data port 114 (e.g., pulsing data port 112 or providing a JTAG refresh instruction via data port 114). Furthermore, as explained further herein in accordance with one or more embodiments of the present invention, full control of the logical values of the output signals provided by PLD 100 during the refresh process can still be provided.

Figure 2:
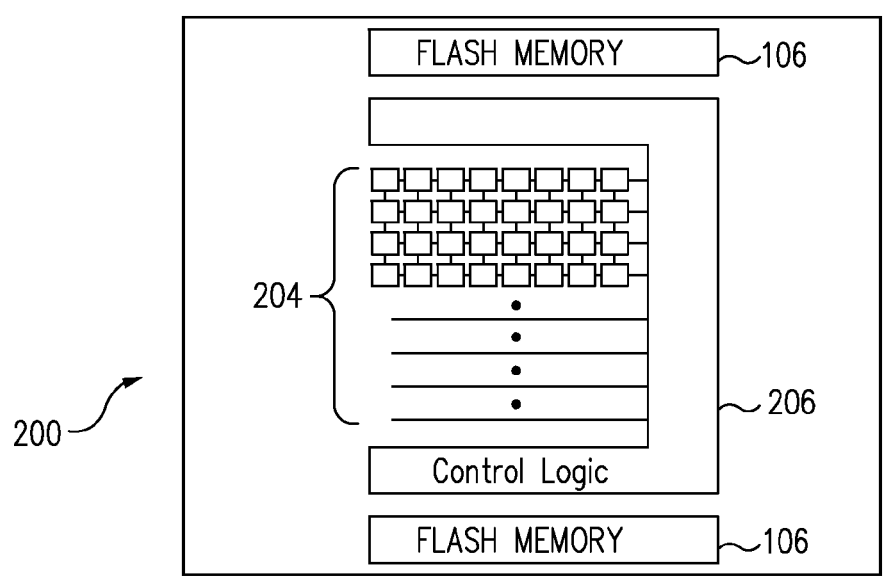
FIG. 2 shows a block diagram illustrating exemplary implementation details for the programmable logic device of FIG. 1 in accordance with an embodiment of the present invention.

As a specific example, FIG. 2 shows a block diagram illustrating a PLD 200, which provides exemplary implementation details for PLD 100 of FIG. 1 in accordance with an embodiment of the present invention. PLD 200 includes non-volatile memory 106 (e.g., flash memory), configuration memory cells 204, and control logic 206.

Configuration memory cells 204 (e.g., volatile SRAM cells or other types of memory, such as fuses or anti-fuses) are used in a conventional manner to store configuration data, which determines the user defined functions of PLD 200 (e.g., determines programmable functions of I/O blocks 102 and logic blocks 104). Control logic 206 controls the internal transfer of the configuration data from non-volatile memory 106 to configuration memory cells 204, as would be understood by one skilled in the art.

It should be understood that flash memory represents an exemplary type of memory for non-volatile memory 106, but other types of non-volatile memory (e.g., EECMOS) that can be reprogrammed once or repeatedly may be substituted for non-volatile memory 106. Furthermore, either non-volatile memory 106 or configuration memory cells 204 may be programmed (i.e., receive and store information in its memory) to store configuration data for PLD 200, but the device functionality of PLD 200 is determined by the information stored in configuration memory cells 204. Thus, PLD 200 is configured (including reconfiguration or partial reconfiguration) when information is programmed into configuration memory cells 204.

It should also be understood, in accordance with one or more embodiments of the present invention, that non-volatile memory 106 and configuration memory cells 204 may each be programmed (including reprogrammed) via data port 112 or data port 114, depending upon the desired application or design requirements. Further details regarding programming may be found in U.S. Pat. No. 6,828,823 and U.S. Patent Publication No. 2005-0189962-A1, published Sep. 1, 2005.

In general, during programming of configuration memory cells 204 and reconfiguration of the PLD (e.g., PLD 100), it would be advantageous to continue to support system operation functions. However, conventional approaches typically used an external bitstream to provide the configuration data directly to the configuration memory of the PLD, while the PLD's output signals are tri-stated or held to logical high or low values. In contrast, in accordance with one or more embodiments of the present invention, techniques are disclosed herein to use background programming to provide the configuration data to the PLD and, during configuration, provide desired PLD output signals that remain glitch-free during the transition from configuration to user mode of the PLD.

Figure 3:
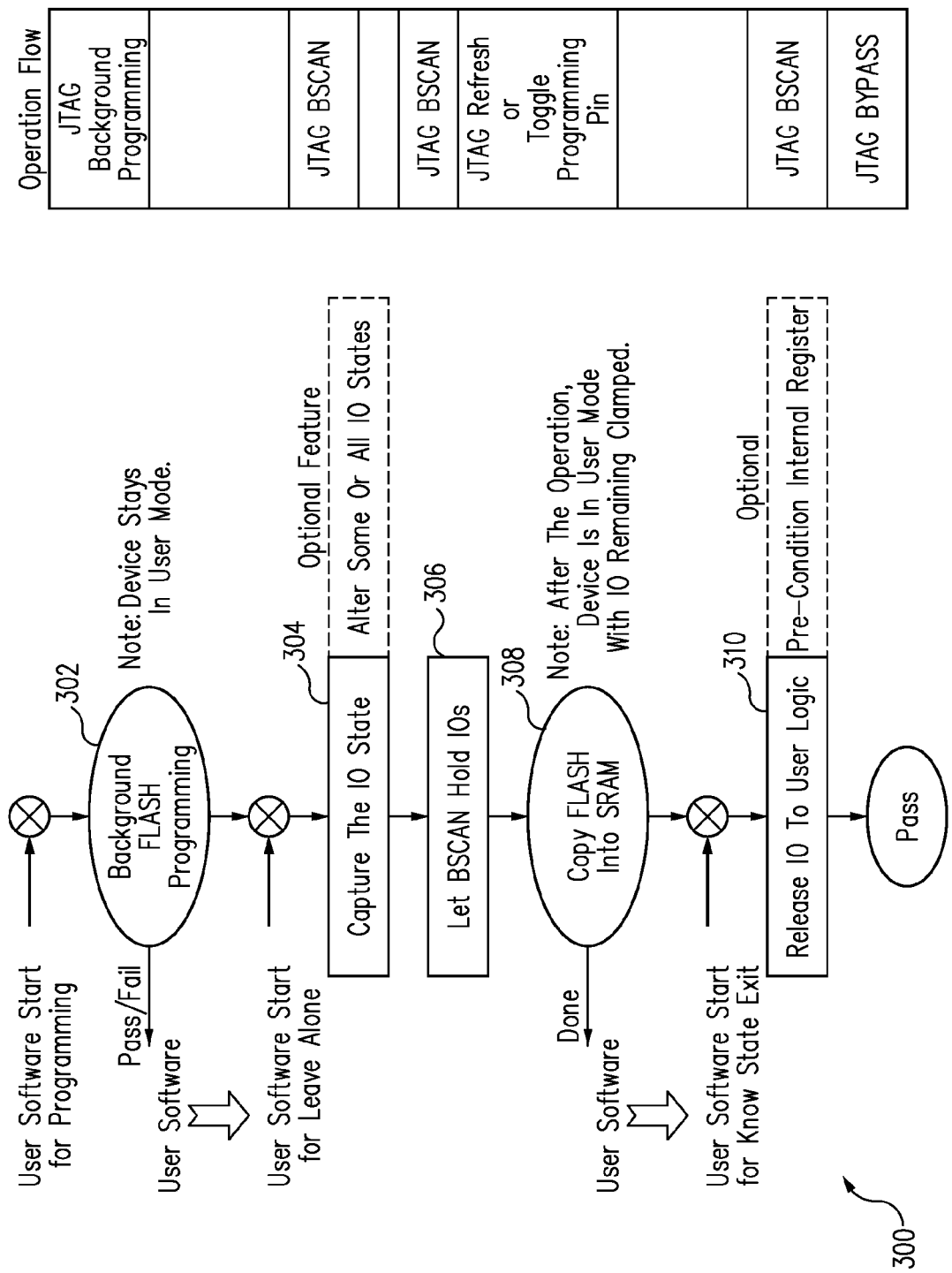
FIG. 3 shows a flowchart illustrating exemplary operations for the programmable logic device of FIG. 1 in accordance with an embodiment of the present invention.

For example, FIG. 3 shows a flowchart 300 illustrating exemplary reconfiguration operations for PLD 100 of FIG. 1 in accordance with an embodiment of the present invention. As discussed further herein, the operations illustrated in flowchart 300 may be controlled by software (e.g., user software) or hardware, as illustrated in an exemplary fashion in FIG. 3 with the corresponding operation flow for the commands and the exemplary software control indicators (user software start).

For example, Lattice Semiconductor Corporation's ispVM software is a Windows-based tool set that facilitates the programming of their PLDs. The ispVM Embedded tool generates C code that, when compiled for and executed on a wide range of embedded processors, enables the programming of the PLDs. Consequently, the ispVM software or other conventional PLD programming software can issue the programming commands directly, such as during prototyping, or generate, for example, an industry-standard Serial Vector Format (SVF) file for reconfiguration in the field. Thus, for example, the SVF file may be used to control the background programming, leave alone operation, refresh process, and the known-state exit operation (e.g., create a delay period for users to apply the vectors to precondition the registers), which are described further herein.

In reference to FIG. 3, background programming is first initiated (302), while the PLD remains in user mode operation with the current configuration data. For example, background programming of non-volatile memory 106 (flash memory) with the new configuration data is performed as the PLD operates based on current configuration data stored in configuration memory cells 204. The background programming may be verified prior to initiating the capture of the I/O states (e.g., current I/O values, such as logical high or low, high impedance values, or sampled) at operation 304. Optionally, the I/O states may be altered as desired by a user, as explained further herein (e.g., via input paths through the boundary scan cells by manipulating pins via an external device or through JTAG).

Using the boundary scan cells at operation 306, the I/O states are held at the captured or desired values and the PLD is reconfigured or refreshed (308) by copying the configuration data from non-volatile memory 106 to configuration memory cells 204. The reconfiguration may be initiated, for example, by pulsing or toggling data port 112 or providing a JTAG instruction (Refresh) to data port 114.

The refresh process may be verified prior to initiating the release of the I/O to the newly configured user-defined logic (operation 310). Optionally, internal registers within the I/O or other portions of the PLD may be preconditioned with data to prevent glitches from occurring during the transition to user-defined logic control of the I/O (e.g., the data for preconditioning provided via input paths through the boundary scan cells). After providing the JTAG instruction (e.g., BYPASS or EXIT_EXTEST), the PLD is now configured and operating based upon the new configuration data, with the I/O output signals under control of the newly configured user logic of the PLD. Furthermore, if the internal registers were preconditioned, the logic outputs exit in the desired state determined by the inputs to the user control logic.

The techniques illustrated may also be referred to herein by the operations of "leave alone I/O" and "known-state exit." The leave alone I/O operation refers to the ability to program in background mode and, while the PLD is refreshed, hold the state of the I/O output pins in a known logic state (e.g., generally operations 302 through 308 of flowchart 300). The known state may be based on the I/O values captured or based on a known system vector that is provided to set the I/O values based on user-predefined settings. Thus, the leave alone I/O allows critical signals (e.g., reset and power enable signals provided by the PLD in a system) to not glitch and to not go active (e.g., float or provide undesired values) while the PLD is reconfigured.

The known state exit operation refers to the updating of some or all of the internal register states with predefined values (e.g., the optional portion of operation 310 of flowchart 300). The values may be provided via I/O pins and input paths through the boundary scan (BSCAN) cells (e.g., as discussed in reference to FIGS. 4 and 5). This operation is useful when the PLD logic that provides the value for the I/O pin may be in a state that would cause the I/O pin to pass through a glitch or inappropriate signal level (e.g., glitch or active level). Thus, the PLD exits to user-defined operation after reconfiguration in a known logic state.

Figure 4:
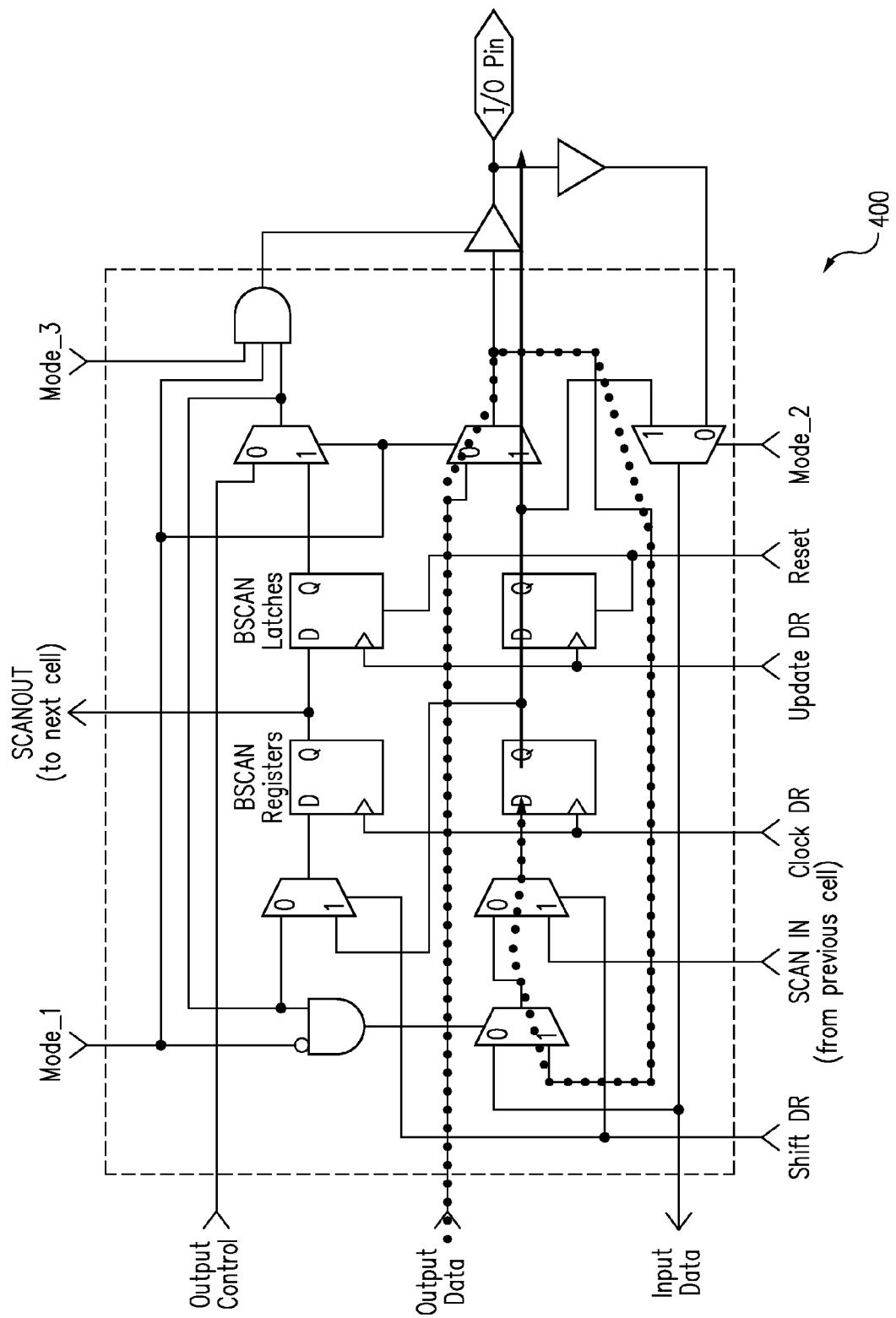
FIG. 4 shows a block diagram illustrating an exemplary circuit implementation for a portion of the programmable logic device of FIG. 1 in accordance with an embodiment of the present invention.

The leave alone operation may be implemented, for example, by using the BSCAN cells within the PLD to capture current I/O pin output states and/or optionally overlay with a custom I/O vector to set desired I/O pin output values. For example, FIGS. 4 and 5 show exemplary block diagram implementations for BSCAN circuits 400 and 500, respectively, for I/O blocks 102 of PLD 100 of FIG. 1 in accordance with an embodiment of the present invention.

BSCAN circuit 400 (BSCAN cell) illustrates that one or more BSCAN registers may be used to store the sampled I/O value to provide as an output signal via an I/O pin (e.g., using the JTAG instruction SAMPLE provided via data port 114 to place output states in BSCAN cell preload registers) and/or overlay a custom vector of user-defined values to provide as the output signal via the I/O pin (e.g., using the JTAG instruction PRELOAD). If custom vector values are provided, these can be preloaded into the PLD just prior to the refresh process (e.g., during operation 304 of flowchart 300). The I/O control can then be transferred to BSCAN circuit 400 (e.g., by using the JTAG instruction EXTEST), with the dotted path and bold arrow illustrating I/O values provided to the I/O pin based on custom vector values or captured I/O values.

BSCAN circuit 500 illustrates another exemplary circuit implementation, in accordance with an embodiment of the present invention, for a BSCAN cell. As an example, BSCAN circuit 500 shows an exemplary input path 502 via the I/O pin, where input path 502 is not blocked by BSCAN circuit 500 and is always available as an input path for providing data into the PLD (e.g., before the refresh process to provide desired I/O values or after the refresh process to precondition internal registers with desired values). Consequently, data and other information may be provided via the input path to user logic and/or registers within the PLD (e.g., to provide values for the known-state exit operation).

Figure 5:
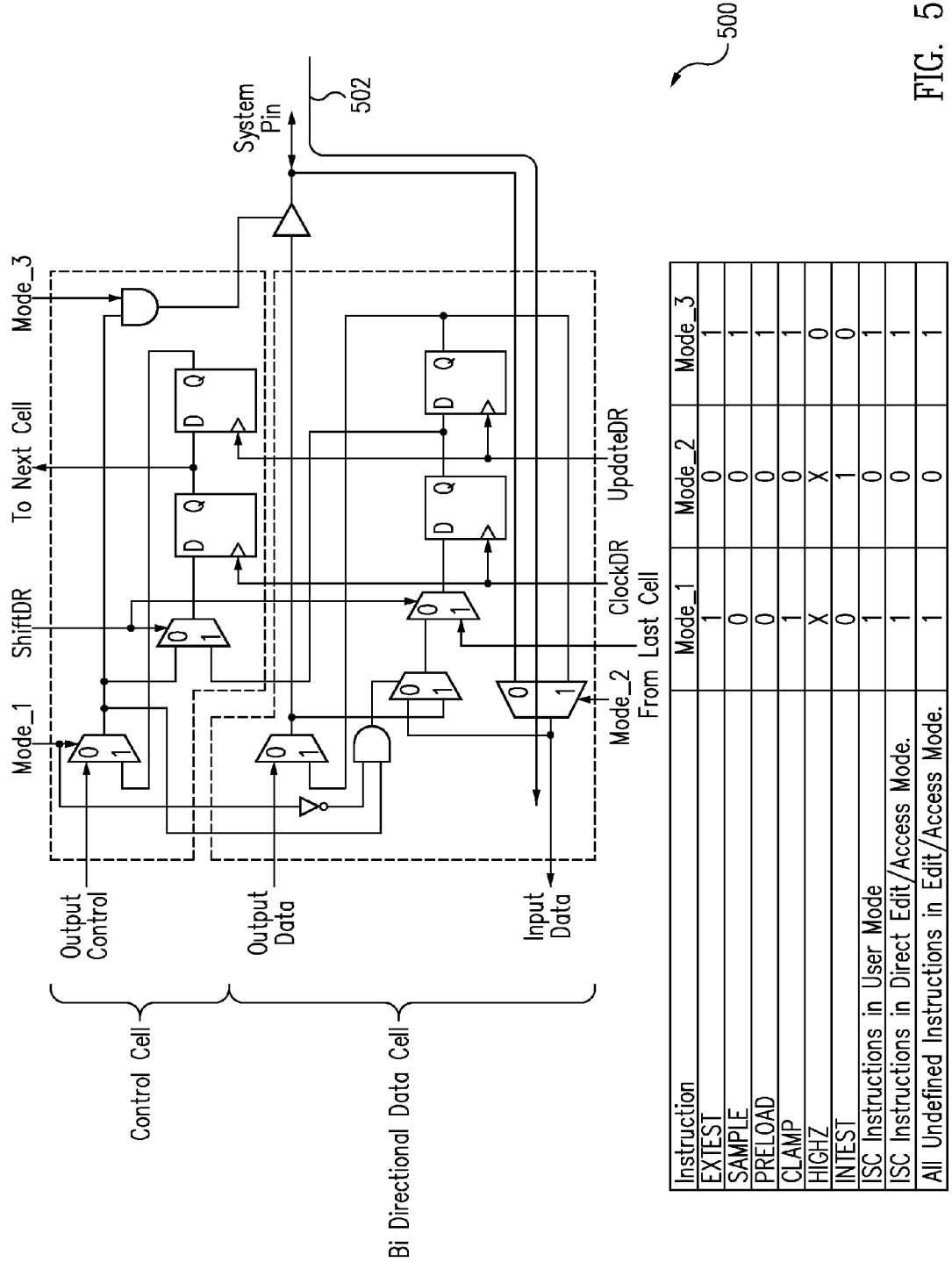
FIG. 5 shows a block diagram illustrating an exemplary circuit implementation for a portion of the programmable logic device of FIG. 1 in accordance with an embodiment of the present invention.

FIG. 5 further provides a table providing various multiplexer control signal values (e.g., for control signals Mode_1, Mode_2, and Mode_3) for corresponding JTAG instructions. Note, for example, that input path 502 is always available through a multiplexer controlled by the Mode 2 control signal for the exemplary JTAG instructions, except for the JTAG INTEST instruction. Further additional details regarding exemplary BSCAN circuits and operation may be found, for example, in U.S. Pat. Nos. 6,304,099 and 6,356,107.

Figure 6:
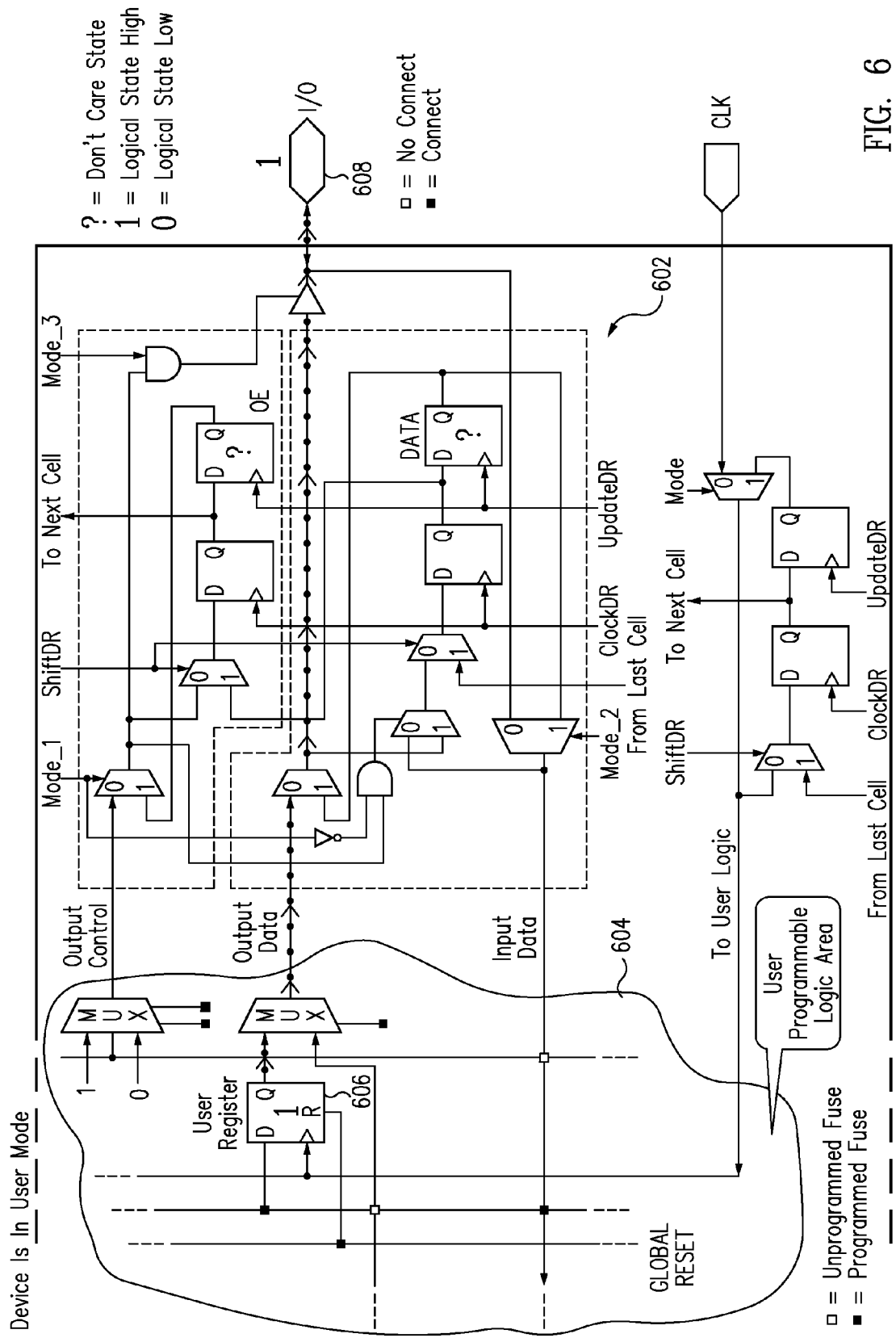
FIGS. 6-8 show block diagrams illustrating exemplary operations associated with a reconfiguration for the programmable logic device of FIG. 1 in accordance with an embodiment of the present invention.
Figure 7:
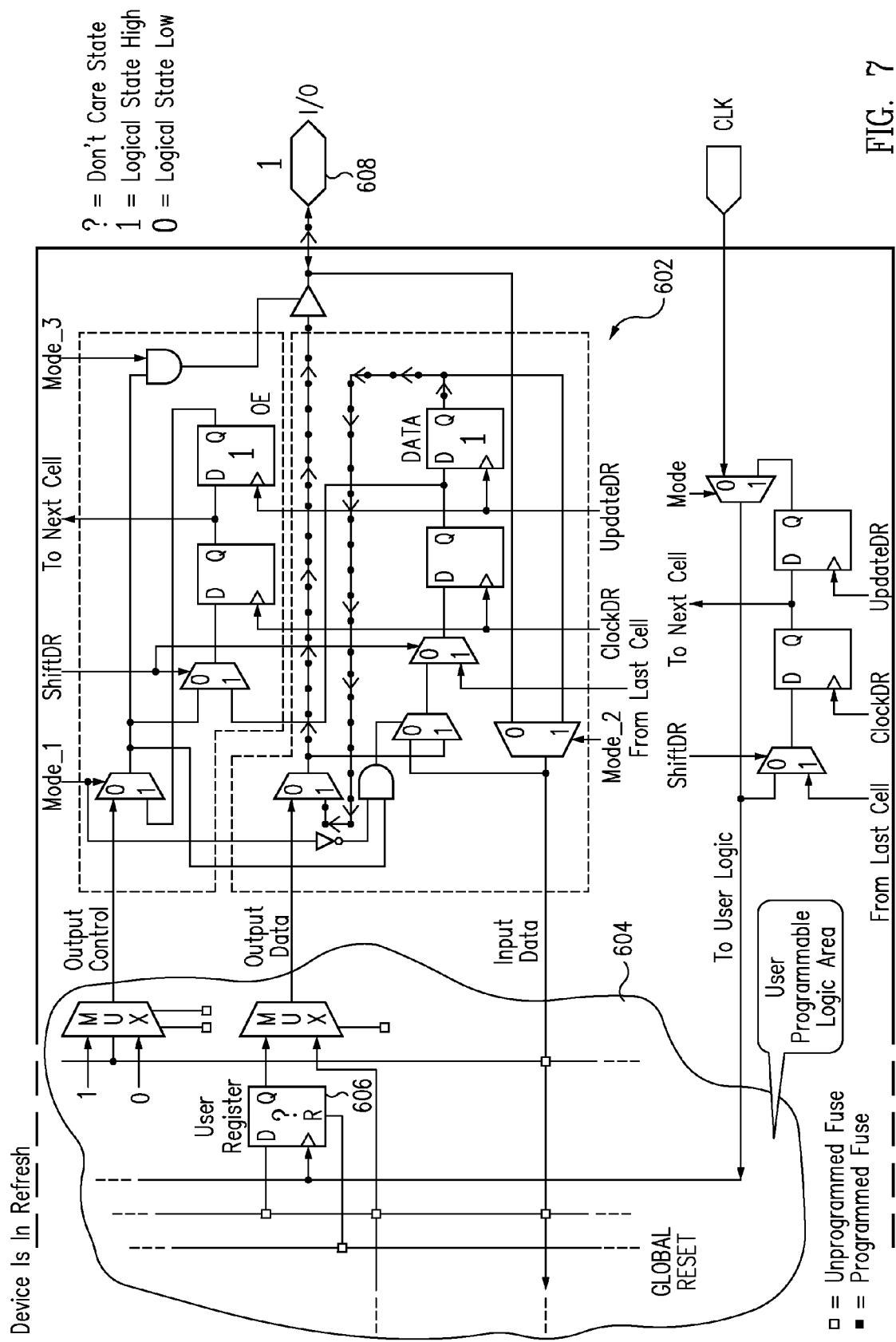
Figure 8:
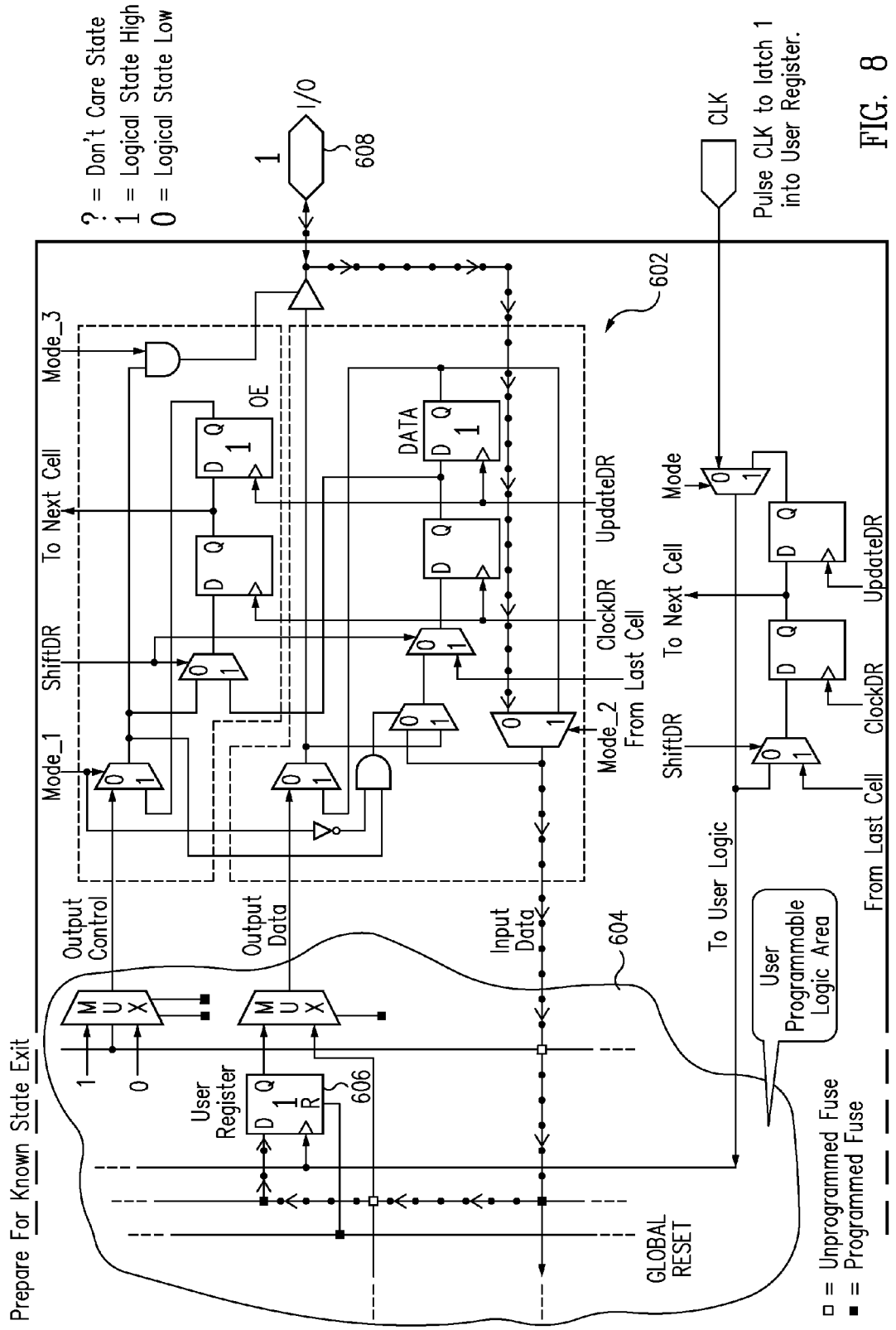

FIGS. 6-8 show block diagrams illustrating exemplary operations associated with a reconfiguration for PLD 100 of FIG. 1 in accordance with an embodiment of the present invention. Specifically, FIGS. 6-8 show an exemplary BSCAN circuit 602 (e.g., similar to BSCAN circuit 500) and a portion of a user programmable logic area 604 of PLD 100.

For example, FIG. 6 shows PLD 100 operating in a user mode of operation prior to the refresh operation. The logical states stored in BSCAN circuit 602 may be unknown (or don't care state as indicated by the question mark) and a user register 606 within logic area 604 may store a logical high value (i.e., a "1"), which user register 606 provides to an I/O pin 608, as shown by the dotted path. It should also be noted that some fuses (e.g., configuration memory cells 204) may be programmed and others may not be programmed within logic area 604, as shown.

FIG. 7 shows PLD 100 during the refresh process. For this example, BSCAN circuit 602 has captured and maintained the logical high value on I/O pin 608 (as shown by the exemplary dotted path), while logic area 604 is being programmed. Thus, during the refresh operation, the fuses within logic area 604 are at some point in an un-programmed state. For example, if the fuse is for a connection, then an un-programmed fuse means no connection.

Furthermore, user register 606 in logic area 604 may not be accessible and may store an unknown value, as shown in FIG. 7. For example, a clock signal provided to user register 606 via a clock pin (CLK) may not be externally held low to maintain the logical high value in user register 606 during the refresh operation. As another example, if the fuse connecting the reset (R) terminal of user register 606 to a global reset signal is programmed, the logical high value stored in user register 606 may be reset to a logical low value when the global reset signal is asserted during the refresh operation.

Alternatively as an example, if the global reset signal is hardwired to the reset terminal of user register 606 and the global reset signal is asserted during the refresh process, then user register 606 will store a logical low value rather than the desired logical high value. Consequently, the known-state exit operation would be required to restore the logical high value in user register 606 and avoid output signal glitches when releasing control of the I/O pin to the new user-defined logic.

FIG. 8 shows PLD 100 after the refresh process and with a known-state exit. User register 606 within logic area 604 has been preconditioned (i.e., preloaded) with a desired logical high value, as shown by the dotted input path, so that the logical high value on I/O pin 608 is maintained glitch-free when user mode of operation resumes. This is possible because the appropriate fuses within logic area 604 have been programmed by the refresh process to provide the proper connections to access user register 606 within logic area 604. Consequently, before transitioning to the user mode of operation and releasing control of I/O pin 608 to the user-defined logic, the appropriate value may be provided via BSCAN circuit 602 to user register 606 within logic area 604. User register 606, in turn, provides the appropriate value to I/O pin 608 when the user mode of operation resumes.

Systems and methods are disclosed herein to provide reconfiguration techniques for PLDs. For example, in accordance with an embodiment of the present invention, techniques are disclosed to provide transparent field reconfiguration such that the PLD can be reconfigured without interrupting system operation (e.g., to provide dynamic programming of programmable devices with embedded volatile fuses (e.g., configuration SRAM) and embedded non-volatile fuses (e.g., flash memory) for a minimally disruptive reconfiguration solution for the PLD).

In general, many system designs, within which the PLD operates, require 99.999% up-time. For example, by using background programming, the PLD continues to operate while the external bitstream is loaded into non-volatile memory. Furthermore, by driving glitch-free known values as output signals via the I/O circuits, the PLD can provide valuable functionality to the system in which it operates, such as to continue to provide power enable, reset, or other critical signals (e.g., which may be used to bring up the system) while the PLD is reconfigured (e.g., in an on-the-fly reconfiguration procedure). Thus, techniques are disclosed herein to control the state of the logic within the PLD prior to exiting the configuration process, which allows the device logic to drive the correct levels on its outputs immediately, when control of I/O is passed back to the PLD logic at the end of the configuration cycle.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
a plurality of boundary scan cells adapted to precondition registers within the programmable logic device with desired signal values prior to release of control of input/output blocks to user-defined logic provided by a reconfiguration;
a plurality of logic blocks;
configuration memory cells adapted to store first configuration data for configuration of the logic blocks and the input/output blocks; and
non-volatile memory adapted to store second configuration data and transfer the second configuration data to the configuration memory cells for the reconfiguration of the logic blocks and the input/output blocks.

2. The programmable logic device of claim 1 including input/output pins associated with the plurality of input/output blocks, wherein at least one of the boundary scan cells provides an input path after the reconfiguration from at least one of the input/output pins to at least one of the registers to precondition with one of the desired signal values.

3. The programmable logic device of claim 1, wherein the boundary scan cells are adapted to capture current output values of the corresponding input/output blocks or receive values provided to the programmable logic device and provide the captured or received values as output signals from the programmable logic device during the reconfiguration of the programmable logic device.

4. The programmable logic device of claim 1 including a plurality of input/output pins corresponding to the plurality of input/output blocks, wherein the boundary scan cells are adapted to provide input paths to the registers after the reconfiguration and prior to release of control of the input/output blocks to the user-defined logic provided by the reconfiguration.

5. The programmable logic device of claim 1, wherein the preconditioned registers are adapted to prevent glitches from being provided by the input/output blocks after the reconfiguration.

6. The programmable logic device of claim 1 including control logic adapted to control the transfer of the second configuration data from the non-volatile memory to the configuration memory.

7. A programmable logic device comprising:
a plurality of input/output blocks and associated input/output pins; and
means for capturing current output states of the input/output blocks and providing as output signals via the input/output pins during the reconfiguration at least one of the current output states and desired output states, wherein the capturing and providing means further provides an input path to the programmable logic device via the input/output pins during the reconfiguration and prior to releasing control of the input/output blocks to user-defined logic.

8. The programmable logic device of claim 7, wherein input data is provided via the input path and corresponding ones of the input/output pins after the reconfiguration to precondition registers prior to releasing control of the input/output blocks.

9. The programmable logic device of claim 8, wherein the preconditioned registers are adapted to prevent glitches from being provided by the input/output blocks after the reconfiguration.

10. A method for performing a reconfiguration of a programmable logic device comprising:
reconfiguring the programmable logic device while providing from the programmable logic device desired output signal values; and
providing input data to the programmable logic device after the reconfiguring to precondition registers within the programmable logic device with the input data prior to releasing control to logic provided by the reconfiguring.

11. The method of claim 10 including performing a background programming operation of the programmable logic device prior to the reconfiguring.

12. A programmable logic device comprising:
a plurality of input/output blocks and associated input/output pins;
a plurality of logic blocks;
configuration memory cells adapted to store first configuration data for a configuration of the logic blocks and the input/output blocks;
non-volatile memory adapted to store second configuration data and transfer the second configuration data to the configuration memory cells for a reconfiguration of the logic blocks and the input/output blocks; and
boundary scan cells configured to hold one or more of the input/output pins of the programmable logic device in a known logic state during transfer of the second configuration data from the non-volatile memory to the configuration memory cells.

13. The programmable logic device of claim 12, wherein the boundary scan cells are adapted to precondition registers within the programmable logic device with desired signal values prior to release of control of the input/output blocks to user-defined logic provided by the reconfiguration.

14. A method for reconfiguring a programmable logic device comprising:
capturing current output signal values of the programmable logic device;
reconfiguring the programmable logic device while providing from the programmable logic device at least one of the captured output signal values; and
preconditioning registers within the programmable logic device with desired signal values prior to releasing control to user-defined logic provided by the reconfiguring.

15. The method of claim 14, wherein the preconditioning stores in at least one of the registers a logical value identical to the captured output signal value provided from the programmable logic device.

16. A method for reconfiguring a programmable logic device comprising:
storing first configuration data within the programmable logic device in volatile configuration memory;
storing second configuration data within the programmable logic device in non-volatile memory;
reconfiguring the volatile configuration memory with the second configuration data from the non-volatile memory; and
maintaining one or more input/output pins of the programmable logic device in a known logic state during the reconfiguring.

17. The method of claim 16 including providing one or more desired signal values to one or more registers within the programmable logic device prior to release of control of the one or more input/output pins to user-defined logic provided by the reconfiguring.

* * * * *